(12) United States Patent
Zhou

(10) Patent No.: US 10,615,357 B2
(45) Date of Patent: Apr. 7, 2020

(54) QUANTUM DOTS LIGHT-EMITTING DIODE AND METHOD FOR MANUFACTURING THE SAME

(71) Applicant: Shenzhen China Star Optoelectronics Technology Co., Ltd., Shenzhen, Guangdong (CN)

(72) Inventor: Kaifeng Zhou, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/523,115

(22) PCT Filed: Mar. 14, 2017

(86) PCT No.: PCT/CN2017/076556
§ 371 (c)(1),
(2) Date: Jul. 16, 2018

(87) PCT Pub. No.: WO2018/152885
PCT Pub. Date: Aug. 30, 2018

(65) Prior Publication Data
US 2018/0323392 A1   Nov. 8, 2018

(30) Foreign Application Priority Data
Feb. 24, 2017   (CN) .......................... 2017 1 0102352

(51) Int. Cl.
*H01L 29/08*   (2006.01)
*H01L 51/50*   (2006.01)
(Continued)

(52) U.S. Cl.
CPC ........ *H01L 51/502* (2013.01); *H01L 51/5004* (2013.01); *H01L 51/5056* (2013.01);
(Continued)

(58) Field of Classification Search
CPC ............... H01L 51/502; H01L 51/5056; H01L 51/5072; H01L 51/5008; H01L 51/5004
See application file for complete search history.

(56) References Cited

U.S. PATENT DOCUMENTS 5,719,467 A    2/1998  Antoniadis et al.
9,005,357 B2*  4/2015  Liu ..................... H01L 51/5056
                                                    106/286.1
(Continued)

FOREIGN PATENT DOCUMENTS

CN   101284931 A   10/2008
CN   201178102 Y   1/2009
(Continued)

OTHER PUBLICATIONS

International Search Report dated Mar. 14, 2017 for International Patent Application No. PCT/CN2017/076556.
(Continued)

*Primary Examiner* — Hsien Ming Lee

(57) ABSTRACT

Disclosed are a quantum dots light-emitting diode and a method for manufacturing the same. The quantum dots light-emitting diode includes an anode, which is arranged on a substrate; a first hole injection layer, which is a neutral hole injection layer and arranged on the anode; a second hole injection layer, which is arranged on the first hole injection layer; a quantum dots light-emitting layer, which is arranged on the second hole injection layer; and a cathode, which is arranged on the quantum dots light-emitting layer.

7 Claims, 2 Drawing Sheets

(51) Int. Cl.
*H01L 51/52* (2006.01)
*H01L 51/56* (2006.01)

(52) U.S. Cl.
CPC ...... *H01L 51/5072* (2013.01); *H01L 51/5088* (2013.01); *H01L 51/5206* (2013.01); *H01L 51/5221* (2013.01); *H01L 51/56* (2013.01); *H01L 2251/552* (2013.01)

(56) References Cited

U.S. PATENT DOCUMENTS

| | | | |
|---|---|---|---|
| 9,960,371 B2* | 5/2018 | Yamaguchi | C07F 15/004 |
| 2011/0291071 A1 | 12/2011 | Kim et al. | |
| 2012/0146010 A1* | 6/2012 | Ueno | H01L 51/5048 257/40 |
| 2012/0197179 A1* | 8/2012 | Khan | A61N 5/062 604/20 |
| 2016/0240730 A1* | 8/2016 | Murayama | H01L 51/502 |

FOREIGN PATENT DOCUMENTS

| | | |
|---|---|---|
| CN | 104538554 A | 4/2015 |
| CN | 105161637 A | 12/2015 |
| CN | 105244451 A | 1/2016 |
| CN | 105826483 A | 8/2016 |
| CN | 106450012 A | 2/2017 |

OTHER PUBLICATIONS

Chinese Office Action dated Feb. 8, 2018 for Chinese Patent Application No. 201710102352.1.

* cited by examiner

QUANTUM DOTS LIGHT-EMITTING DIODE AND METHOD FOR MANUFACTURING THE SAME

CROSS-REFERENCE TO RELATED APPLICATIONS

This application claims the priority of Chinese patent application CN 201710102352.1, entitled "Quantum Dots Light-Emitting Diode and Method for Manufacturing the same" and filed on Feb. 24, 2017, the entirety of which is incorporated herein by reference.

FIELD OF THE INVENTION

The present disclosure relates to the technical field of display, and in particular, to a quantum dots light-emitting diode and a method for manufacturing the same.

BACKGROUND OF THE INVENTION

A QLED (Quantum Dots Light-Emitting Diode), like an OLED (Organic Light-Emitting Diode), can emit light on its own and has advantages of rapid response rate, wide viewing angle, lightweight, low power consumption and so forth. Since it has higher color purity, it can achieve wider color gamut when applied in a display device. Ligands on a surface of a quantum dot material can be modified and a quantum dot material is easily soluble in many solvents. Quantum dot materials thus are very suitable for low-cost solution processing techniques.

As a commercially used hole-injection-layer material, PEDOT:PSS is widely used in solution processed QLEDs so that the QLEDs can have excellent properties. However, PEDOT:PSS has a PH value between 1 and 3 at normal temperature, showing an acidic characteristic.

According to relevant researches, the acidic PEDOT:PSS may result in an unstable anodic interface, and thus reduce the life span of a diode. The main reason is as follows. The $In_2O_3$ (Indium (III) oxide) component of ITO (Indium Tin Oxide) may dissolve in an acidic environment, which results in that indium of ITO migrates to PEDOT:PSS, thus increasing the hole injection barrier. If indium spreads to a quantum dots light-emitting layer, it may result in the quenching of excitons and thus the efficiency and the life span of the diode will be reduced greatly.

SUMMARY OF THE INVENTION

In order to solve the above problem, a quantum dots light-emitting diode and a method for manufacturing the same are provided in the present disclosure for controlling a concentration of holes injected into an anode and improving the stability and life span of the diode.

According to one aspect of the present disclosure, a quantum dots light-emitting diode is provided. The quantum dots light-emitting diode comprises:

an anode, which is arranged on a substrate;
a first hole injection layer, which is a neutral hole injection layer and arranged on the anode;
a second hole injection layer, which is arranged on the first hole injection layer;
a quantum dots light-emitting layer, which is arranged on the second hole injection layer; and
a cathode, which is arranged on the quantum dots light-emitting layer.

According to one embodiment of the present disclosure, the second hole injection layer is an acidic hole injection layer.

According to one embodiment of the present disclosure, a HOMO energy level of a material of the first hole injection layer is between a HOMO energy level of a material of the anode and a HOMO energy level of a material of the quantum dots light-emitting layer.

According to one embodiment of the present disclosure, the materials of the first hole injection layer include PTPDES, PTPDES:TPBAH, PFO-co-NEPBN, and PFO-co-NEPBN:F4-TCNQ.

According to one embodiment of the present disclosure, the materials of the second hole injection layer include PEDOT:PSS.

According to one embodiment of the present disclosure, a hole transporting layer is arranged between the second hole injection layer and the quantum dots light-emitting layer.

According to one embodiment of the present disclosure, an electron transporting layer is arranged between the quantum dots light-emitting layer and the cathode.

According to another aspect of the present disclosure, a method for manufacturing quantum dots light-emitting diode is provided. The method comprises steps of:

forming an anode on a substrate;
forming a neutral first hole injection layer on the anode;
forming a second hole injection layer on the first hole injection layer;
forming a quantum dots light-emitting layer on the second hole injection layer; and
forming a cathode on the quantum dots light-emitting layer.

According to one embodiment of the present disclosure, the method further comprises: forming a hole transporting layer on the second hole injection layer before the formation of the quantum dots light-emitting layer.

According to one embodiment of the present disclosure, the method further comprises: forming an electron transporting layer on the quantum dots light-emitting layer before the formation of the cathode.

The present disclosure achieves the following beneficial effects.

In the present disclosure, by providing a double-layer hole injection structure, the anode ITO is protected from corrosion which may be caused by direct contact with acidic PEDOT:PSS. In the meantime, the concentration of the holes injected into the can be regulated, which can improve the stability and life span of the diode and meanwhile solve the problem of relatively rapid efficiency roll-off in the diode at high current density.

Other merits, objectives and features of the present disclosure will be illustrated in the following description, and to some certain degree, become self-evident therefrom, or be understood through implementation of the present disclosure. The objectives and other merits of the present disclosure can be achieved and obtained through the structures specifically indicated in the description, claims, and the accompanying drawings.

BRIEF DESCRIPTION OF THE DRAWINGS

The drawings are provided for further illustrating the technical solutions of the present disclosure or the prior art and constitute a part of the description. The drawings expressing the embodiments of the present application, together with the embodiments of the present application, are used to explain, rather than limit the technical solutions of the present application.

DETAILED DESCRIPTION OF THE EMBODIMENTS

In the following part, the implementation ways of the present disclosure will be illustrated in detail in conjunction with the figures and the embodiments and thus one can fully understand the process of how to apply the technical means to solve the technical problem in the present disclosure and achieve the corresponding technical effects and carry it out accordingly. Under the no-conflict precondition, the embodiments of the present application and features of the embodiments can be combined with each other; all the formed technical solutions are within the protection scope of the present disclosure.

Figure 1:
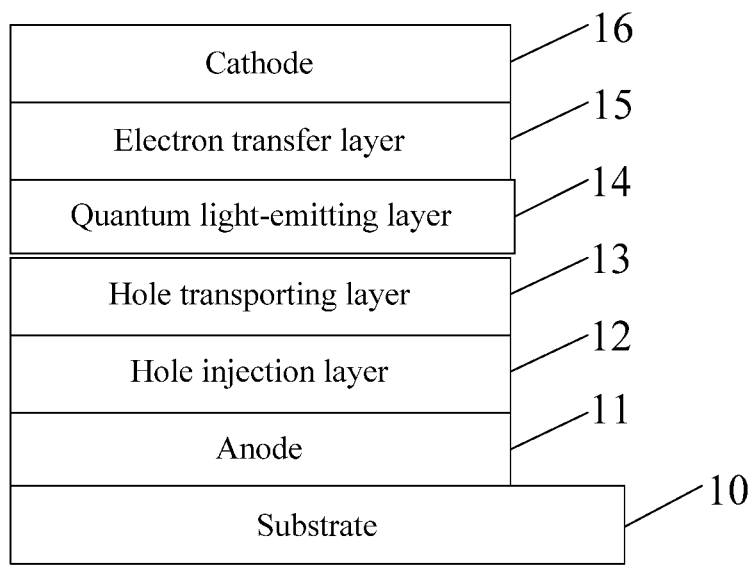
FIG. 1 is a schematic diagram showing structure of a quantum dots light-emitting diode in the prior art.

FIG. 1 shows a schematic diagram of structure of a quantum dots light-emitting diode in the prior art. The quantum dots light-emitting diode comprises an anode 11, a hole injection layer 12, a hole transporting layer 13, a quantum dots light-emitting layer 14, an electron transporting layer 15, and a cathode 16 arranged from bottom to top in sequence. The anode 11 is usually an ITO anode arranged on a substrate 10. The hole injection layer 12 usually adopts a PEDOT:PSS material, which is acidic and may corrode the anode 11 and thus influence the property of the quantum dots light-emitting diode.

Figure 2:
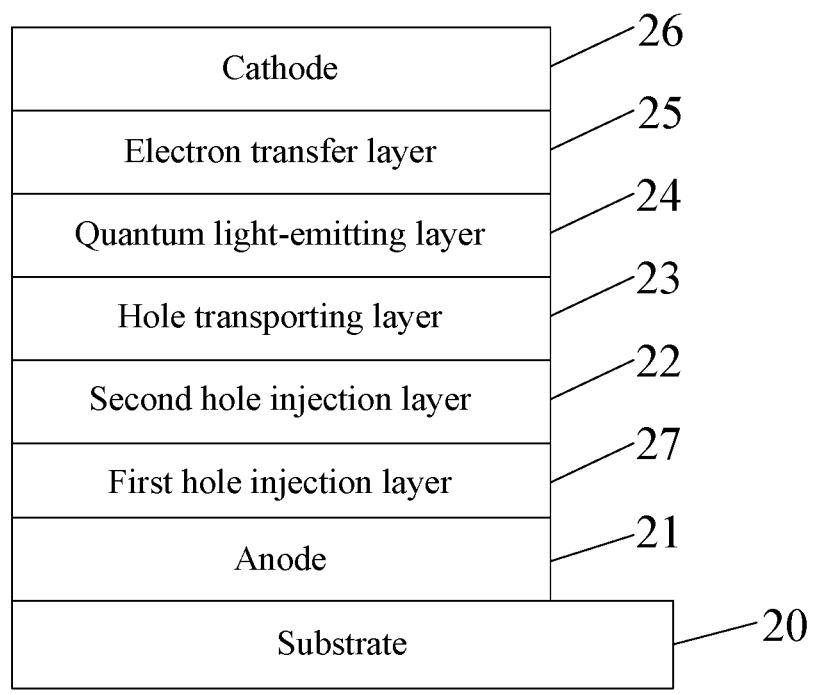
FIG. 2 is a schematic diagram of structure of a quantum dots light-emitting diode in one embodiment of the present disclosure.

In view of the foregoing, a quantum dots light-emitting diode is provided in the present disclosure. FIG. 2 shows a schematic diagram of structure of a quantum dots light-emitting diode in one embodiment of the present disclosure. In the following part, the present disclosure will be illustrated in detail with reference to FIG. 2.

As shown in FIG. 2, the quantum dots light-emitting diode comprises an anode 21, a first hole injection layer 27, a second hole injection layer 22, a quantum dots light-emitting layer 24, and a cathode 26 arranged from bottom to top in sequence.

The anode 21 is arranged on a substrate 20, and is usually made of ITO (IndiumTinOxide) and used for outputting holes. The first hole injection layer 27 is a neutral hole injection layer, which is arranged on the anode 21 and can regulate a concentration of the injected holes. The second hole injection layer 22 is arranged on the first hole injection layer 27, which is useful for injecting the holes to the quantum dots light-emitting layer 24. The quantum dots light-emitting layer 24 is arranged on the second hole injection layer 22, and is used for emitting light. The cathode 26 is arranged on the quantum dots light-emitting layer 24, and is used for outputting electrons to the quantum dots light-emitting layer 24 so that the quantum dots light-emitting layer 24 emits light under the action of the holes and the electrons.

In the present disclosure, the concentration of the injected holes can be regulated by adding and arranging the neutral first hole injection layer 27 between the anode 21 and the second hole injection layer 22 and regulating the material of the first hole injection layer 27. Moreover, when the second hole injection layer 22 is made of a non-neutral material, the neutral first hole injection layer 27 can prevent the corrosion of the anode 21 by the second hole injection layer 22.

In one embodiment of the present disclosure, a hole transporting layer 23 is arranged between the second hole injection layer 22 and the quantum dots light-emitting layer 24, as shown in FIG. 2. The holes, which are output by the anode 21, flow through the first hole injection layer 27 and the second hole injection layer 22, and is then transferred to the quantum dots light-emitting layer 24 via the hole transporting layer 23.

In one embodiment of the present disclosure, an electron transporting layer 25 is arranged between the quantum dots light-emitting layer 24 and the cathode 26, as shown in FIG. 2. The electrons output by the cathode 26 are transferred to the quantum dots light-emitting layer 24 via the electron transporting layer 25.

In one embodiment of the present disclosure, the second hole injection layer 22 is an acidic hole injection layer. To configure the second hole injection layer 22 to be an acidic hole injection layer is beneficial for conveying the holes to the hole transporting layer 23; however, the acidic hole injection layer may corrode the anode 21. The neutral first hole injection layer 27, which is arranged between the anode 21 and the second hole injection layer 22, can prevent the second hole injection layer 22 from corroding the anode 21. Therefore, it is required that the neutral first hole injection layer 27 be made of a material that is soluble in organic solvents and unaffected by the acidic second hole injection layer 22 and has a hole injection property, the material including but not limited to organic materials.

In one embodiment of the present disclosure, the material of the second hole injection layer 22 comprises PEDOT:PSS. That is to say, the second hole injection layer 22 is made of acidic PEDOT:PSS. PEDOT:PSS is a polymer and an aqueous solution thereof has a high electrical conductivity. Different ingredients can be used to obtain PEDOT:PSS aqueous solutions with different electrical conductivities. PEDOT:PSS is a mixture of PEDOT and PSS. PEDOT is a polymer of EDOT (3, 4-ethylenedioxythiophene) monomer. PSS is polystyrenesulfonate salt. These two materials are mixed together to greatly improve solubility of PEDOT, and a mixture thereof can be used to transport the holes. Of course, the material of the second hole injection layer 22 of the present disclosure is not limited to PEDOT:PSS. Other materials that can transport the holes are also suitable for the present disclosure.

The first hole injection layer 27 is arranged between the anode 21 and the second hole injection layer 23 for transferring the holes. Hence, in one embodiment of the present disclosure, a HOMO (Highest Occupied Molecular) energy level of the material of the first hole injection layer is set between a HOMO energy level of a material of the anode 21 and a HOMO energy level of a material of the quantum dots light-emitting layer 24 so that the HOMO energy level differences among the anode 21, the first hole injection layer 27, and the quantum dots light-emitting layer 24 can have a same variation trend. This is helpful in transporting the holes to the quantum dots light-emitting layer 24 by the anode 21.

In one embodiment of the present disclosure, the material of the first hole injection layer 27 is selected from the group consisting of PTPDES, PTPDES:TPBAH, PFO-co-NEPBN, and PFO-co-NEPBN:F4-TCNQ. All these materials can be used to manufacture the first hole injection layer 27. These materials can be obtained by conventional experimental means in laboratories.

PTPDES (tetraphenyldiamine-containing poly arylene ether sulfone) is a polyarylene ether-type polymer material having a hole transfer property, and can be used as a hole transfer material for a quantum dots light-emitting diode. PTPDES:TPBAH is a composition comprising P-doped PTPDES. TPBAH (tris(4-bromophenyl) aminium hexachloroantimonate) is a bromophenyl salt-type electron acceptor, which can be used in P doping.

PFO-co-NEPBN (poly(9,9-dioctylfluorene-co-bis-N,N-(4-ethoxycarbonylphenyl)-bis-N,N-phenyl benzidine) is a polyfluorene-type copolymer having a hole transfer property, and can be used as a hole transfer material. PFO-co-NEPBN:F4-TCNQ is a composition comprising P-doped PFO-co-NEPBN. F4-TCNQ (2,3,5,6-Tetrafluoro-7,7,8,8-tetracyanoquinodimethane) is a micromolecule P-type dopant, which can be used in P-doping.

In the present disclosure, by providing a double-layer hole injection structure, the anode ITO is prevented from corrosion which may be caused by direct contact with acidic PEDOT:PSS. In the meantime, the concentration of the holes injected into the anode can be regulated, which can improve the stability and life span of the diode and meanwhile solve the problem of relatively rapid efficiency roll-off in the diode at high current density.

Figure 3:
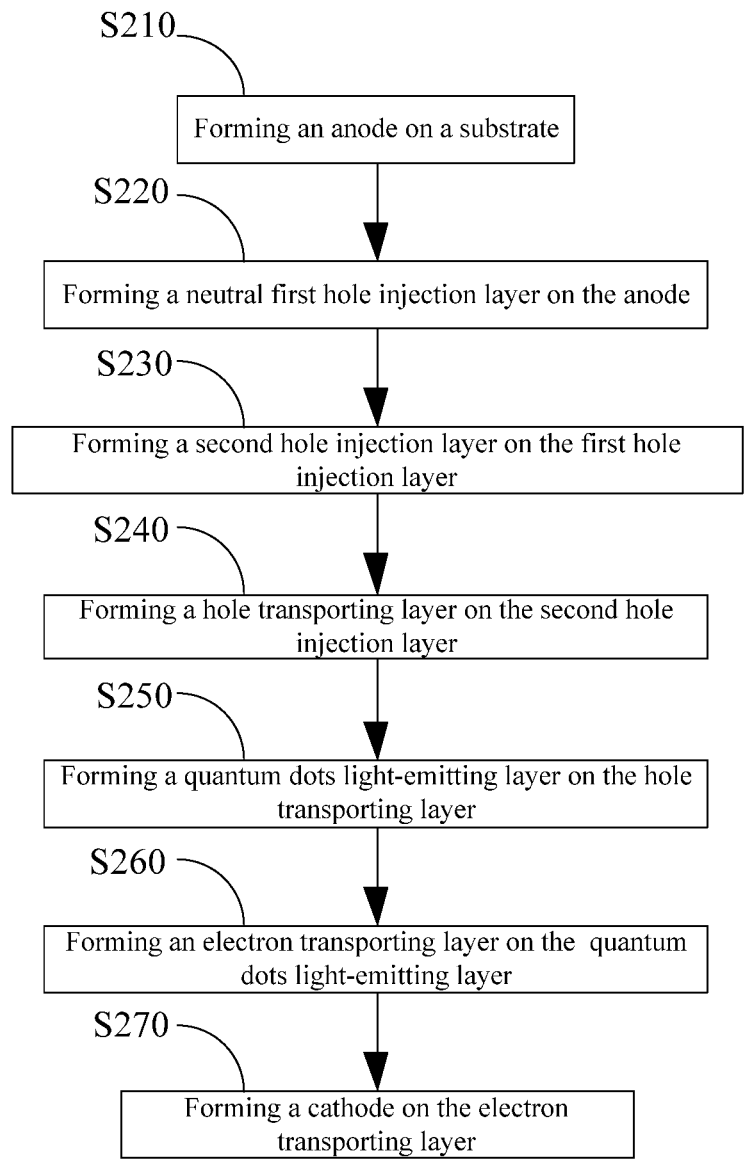
FIG. 3 is a flow diagram of a manufacturing process of a quantum dots light-emitting diode in one embodiment of the present disclosure.

According to another aspect of the present disclosure, a method for manufacturing a quantum dots light-emitting diode is provided. The method specifically comprises several steps shown in FIG. 3.

Firstly, in step S210, an anode is formed on a substrate. Specifically, the anode 21 is formed on the substrate 20. The anode 21 is, for example, an ITO anode.

In step S220, a neutral first hole injection layer 27 is formed on the anode. After the formation of the anode 21, a surface of the substrate is cleaned and treated, and then a solution deposition method is adopted to form the neutral first hole injection layer 27. Specifically, spin-coating and heat treatment are adopted to form the first hole injection layer 27 having a thickness of 20 nm. The first hole injection layer 27 is an organic material soluble in organic solvents having a neutral character, and it is used to planarize a surface of the ITO anode and meanwhile improve hole injection property of the anode.

The material for manufacturing the first hole injection layer is selected from any one of PTPDES, PTPDES:TPBAH, PFO-co-NEPBN or PFO-co-NEPBN:F4-TCNQ. The abovementioned four materials can be obtained by conventional experimental means.

In step S230, a second hole injection layer 22 is formed on the first hole injection layer 27. The second hole injection layer 22 is formed in the solution deposition method. The second hole injection layer 22 is an acidic hole injection layer and the manufacturing materials thereof include PEDOT:PSS.

In step S240, a hole transporting layer 23 is formed on the second hole injection layer 22. The hole transporting layer 23 is formed in the solution deposition method. Specifically, spin-coating and heat treatment are adopted to form the hole transporting layer 24 having a thickness of 30 nm.

In step S250, a quantum dots light-emitting layer 24 is formed on the hole transporting layer 23. The quantum dots light-emitting layer 24 is formed in the solution deposition method. Specifically, spin-coating and heat treatment are adopted to form the quantum dots light-emitting layer 24 having a thickness of 20 nm.

In step S260, the electron transporting layer 25 is formed on the quantum dots light-emitting layer 24 in the. The electron transporting layer 25 is formed in the solution deposition method. Specifically, spin-coating and heat treatment are adopted to form the electron transporting layer 25 having a thickness of 30 nm.

Lastly, in step S270, a cathode 26 is formed on the electron transporting layer 25. Specifically, a vacuum evaporation method is adopted to form AL cathode having a thickness of 100 nm. After the formation of the cathode 26, the quantum dots light-emitting diode can be encapsulated.

Of course, besides the solution deposition method, other methods can also be adopted in the present disclosure to form each of the layers, and the present disclosure is not limited thereto.

In one embodiment of the present disclosure, before the formation of the second hole injection layer 22 on the first hole injection layer 27, a surface of the first hole injection layer 27 may be subjected to hydrophilic treatment. Specifically, $O_2$ Plasma can be adopted for the hydrophilic treatment. When the second hole injection layer 22 is made of the water soluble PEDOT:PSS, it is difficult to form a film of the second hole injection layer 22 on the first hole injection layer 27 directly. By the hydrophilic treatment of the first hole injection layer 27, the surface hydrophilicity of the first hole injection layer 27 can be improved and the contact angle is reduced so that a homogeneous PEDOT:PSS film can be formed on the first hole injection layer 27.

The embodiments of the present disclosure are disclosed as above. However, said embodiments are provided merely for the convenience of understanding the present disclosure rather than limiting the present disclosure. Under the condition of not departuring from the spirit and scope of the present disclosure, any person skilled in the art can make any amendment and variation towards the implementation mode and details. However, the protection scope of the present disclosure will still be in accordance with the scope defined in the attached claims.

The invention claimed is:

1. A quantum dots light-emitting diode, comprising:
an anode, which is arranged on a substrate;
a first hole injection layer, which is a neutral hole injection layer and arranged on the anode;
a second hole injection layer, which is arranged on the first hole injection layer;
a quantum dots light-emitting layer, which is arranged on the second hole injection layer;
a hole transporting layer, which is arranged between the second hole injection layer and the quantum dots light-emitting layer; and
a cathode, which is arranged on the quantum dots light-emitting layer;
wherein the first hole injection layer is made of a material different from that of the second hole injection layer, and the first hole injection layer is the neutral hole injection layer while the second hole injection layer is an acidic hole injection layer such that the first hole injection layer has a capability of preventing corrosion of the anode by the second hole injection layer.

2. The quantum dots light-emitting diode according to claim 1, wherein a HOMO energy level of a material of the first hole injection layer is between a HOMO energy level of a material of the anode and a HOMO energy level of a material of the quantum dots light-emitting layer.

3. The quantum dots light-emitting diode according to claim 1, wherein the materials of the first hole injection layer is selected from a group consisting of PTPDES, PTPDES:TPBAH, PFO-co-NEPBN, and PFO-co-NEPBN:F4-TCNQ.

4. The quantum dots light-emitting diode according to claim 1, wherein the materials of the second hole injection layer include PEDOT:PSS.

5. The quantum dots light-emitting diode according to claim 1, wherein an electron transporting layer is arranged between the quantum dots light-emitting layer and the cathode.

6. A method for manufacturing a quantum dots light-emitting diode, wherein the method comprises:
   forming an anode on a substrate;
   forming a neutral first hole injection layer on the anode;
   forming a second hole injection layer on the first hole injection layer;
   forming a hole transporting layer on the second hole injection layer;
   forming a quantum dots light-emitting layer on the hole transporting layer; and
   forming a cathode on the quantum dots light-emitting layer;
   wherein the first hole injection layer is made of a material different from that of the second hole injection layer, and the first hole injection layer is the neutral hole injection layer while the second hole injection layer is an acidic hole injection layer such that the first hole injection layer has a capability of preventing corrosion of the anode by the second hole injection layer.

7. The method according to claim 6, further comprising forming an electron transporting layer on the quantum dots light-emitting layer before the formation of the cathode.

\* \* \* \* \*